United States Patent [19]

Ohizumi

[11] Patent Number: 5,721,861
[45] Date of Patent: Feb. 24, 1998

[54] ARRAY DISC MEMORY EQUIPMENT CAPABLE OF CONFIRMING LOGICAL ADDRESS POSITIONS FOR DISC DRIVE MODULES INSTALLED THEREIN

[75] Inventor: Yumiko Ohizumi, Kawasaki, Japan

[73] Assignee: Fujitsu Limited, Kawasaki, Japan

[21] Appl. No.: 183,906

[22] Filed: Jan. 21, 1994

Related U.S. Application Data

[63] Continuation of Ser. No. 717,261, Jun. 18, 1991, abandoned.

[30] Foreign Application Priority Data

Jun. 19, 1990 [JP] Japan ................................. 2-160315

[51] Int. Cl.$^6$ ................................................. G06F 12/16
[52] U.S. Cl. ..................... 395/441; 395/490; 395/412
[58] Field of Search ..................... 395/425, 400, 395/500, 441, 182.04, 182.05, 439, 440, 185.06, 186, 490, 412; 371/8.1, 10.2, 10.3, 419, 40.1

[56] References Cited

U.S. PATENT DOCUMENTS

| | | | |
|---|---|---|---|
| 3,704,363 | 11/1972 | Salmassy et al. | 371/5.1 |
| 4,020,468 | 4/1977 | Silver et al. | 395/575 |
| 4,607,328 | 8/1986 | Furukawa et al. | 395/250 |
| 4,775,978 | 10/1988 | Hartness | 371/38 |
| 4,870,643 | 9/1989 | Bultman et al. | 371/11.1 |
| 4,876,668 | 10/1989 | Thakoor et al. | 365/163 |
| 4,914,656 | 4/1990 | Dunphy, Jr. et al. | 371/10.2 |
| 5,075,805 | 12/1991 | Peddle et al. | 360/61 |
| 5,128,810 | 7/1992 | Halford | 360/39 |
| 5,134,619 | 7/1992 | Henson et al. | 371/40.1 |
| 5,148,432 | 9/1992 | Gordon et al. | 371/10.1 |
| 5,210,844 | 5/1993 | Shimura et al. | 395/480 |

FOREIGN PATENT DOCUMENTS

| | | |
|---|---|---|
| 0 369 707 | 5/1990 | European Pat. Off. . |
| 90 00280 | 1/1990 | WIPO . |

OTHER PUBLICATIONS

European Search Report, The Hague, Dec. 8, 1993.

*Primary Examiner*—Matthew M. Kim
*Assistant Examiner*—Hiep T. Nguyen
*Attorney, Agent, or Firm*—Staas & Halsey

[57] ABSTRACT

An array disc memory apparatus connected to a computer and including disc drive modules for storing divided data. The apparatus provides means for confirming whether identification information read from disc drive modules installed in the equipment coincides with reference identification information read from disc drive modules previously installed in the same position every time the disc drive modules are replaced, increased or decreased, and produces either an alarm signal for stopping the computer sending a data write or read command to the array disc memory equipment or a data path instruction for allowing the divided data to be correctly written or read from the disc drive modules when the identification information does not coincide with the reference identification information.

21 Claims, 7 Drawing Sheets

TABLE 100

| LOGICAL ADDRESSES FOR DRIVES | MF Nos. | REMARKS | | |
|---|---|---|---|---|
| | | CONNEC. | MIS-MATCH | TROUBLE |
| 1st DRIVE IN LD2 | 001 | "1" | | |
| 2nd DRIVE IN LD2 | 002 | "1" | | |
| 3rd DRIVE IN LD2 | 003 | "1" | "1" | |
| 4th DRIVE IN LD2 | 004 | "1" | | "1" |
| 1st DRIVE IN LD3 | 005 | "1" | | |
| 2nd DRIVE IN LD3 | 006 | "1" | | |
| 3rd DRIVE IN LD3 | 007 | "1" | | |
| 4th DRIVE IN LD3 | 008 | "1" | | |
| | | | | |
| | | | | |
| | | | | |

TABLE 100

| LOGICAL ADDRESSES FOR DRIVES | MF Nos. | REMARKS | | |
|---|---|---|---|---|
| | | CONNEC. | MIS-MATCH | TROUBLE |
| 1st DRIVE IN LD2 | 001 | "1" | | |
| 2nd DRIVE IN LD2 | 002 | "1" | | |
| 3rd DRIVE IN LD2 | 003 | "1" | "1" | |
| 4th DRIVE IN LD2 | 004 | "1" | | "1" |
| 1st DRIVE IN LD3 | 005 | "1" | | |
| 2nd DRIVE IN LD3 | 006 | "1" | | |
| 3rd DRIVE IN LD3 | 007 | "1" | | |
| 4th DRIVE IN LD3 | 008 | "1" | | |
| | | | | |
| | | | | |
| | | | | |
| | | | | |

| LOGICAL ADDRESSES FOR DRIVES | REFER-ENCE MF Nos. | REMARKS | | | READ MF Nos. |
|---|---|---|---|---|---|
| | | CONNEC. | MIS-MATCH | TROUBLE | |
| 1st D. (LD3) | 001 | "1" | | | 001 |
| 2nd D. (LD3) | 002 | "1" | | | 002 |
| 3rd D. (LD3) | 003 | "1" | | | 003 |
| 4th D. (LD3) | 004 | "1" | | | 004 |

FIG. 7

| LOGICAL ADDRESSES FOR DRIVES | REFER-ENCE MF Nos. | REMARKS | | | READ MF Nos. |
|---|---|---|---|---|---|
| | | CONNEC. | MIS-MATCH | TROUBLE | |
| 1st D. (LD3) | 001 | "1" | | | 001 |
| 2nd D. (LD3) | 021 | "1" | | | 021 |
| 3rd D. (LD3) | 003 | "1" | | | 003 |
| 4th D. (LD3) | 004 | "1" | | | 004 |

FIG. 8

| LOGICAL ADDRESSES FOR DRIVES | REFER-ENCE MF Nos. | REMARKS | | | READ MF Nos. | BELONGED TO THE SAME LD? | DATA PATH TO BE CON-NECTED TO |
|---|---|---|---|---|---|---|---|
| | | CONNEC. | MIS-MATCH | TROUBLE | | | |
| 1st D. (LD3) | 001 | "1" | | | 001 | "1" | 1st D. |
| 2nd D. (LD3) | 021 | "1" | "1" | | 003 | "1" | 3rd D. |
| 3rd D. (LD3) | 003 | "1" | "1" | | 021 | "1" | 2nd D. |
| 4th D. (LD3) | 004 | "1" | | | 004 | "1" | 4th D. |

ARRAY DISC MEMORY EQUIPMENT CAPABLE OF CONFIRMING LOGICAL ADDRESS POSITIONS FOR DISC DRIVE MODULES INSTALLED THEREIN

This application is a continuation of application Ser. No. 07/717,261, filed Jun. 18, 1991, now abandoned.

BACKGROUND OF THE INVENTION

1. Field of the Invention

The present invention relates to an array disc memory equipment capable of confirming logical address positions for disc drive modules installed therein, and more particularly to an array disc memory equipment capable of confirming logical address positions for the disc drive units when the disconnection and/or connection of cables attached to the disc drive modules is performed due to the replacement or the expansion of the disc drive modules.

2. Description of the Related Art

Since computer processing speed has increased, transfer speed and data capacity have increased in auxiliary memory equipment of the computer. Array disc memory equipment, which will be shortened "array disc equipment" hereinafter, is one example of the auxiliary memory equipment, having been developed for writing and reading a large amount of data and from the computer at high speed.

The array disc equipment consists of a number of disc drive modules and a control unit for controlling the modules. When the array disc equipment is commanded by controlling equipment of the computer, such as a channel, to perform data writing or data reading, the control unit divides a datum sent from the channel, into divided data each having a proper length. Then the control unit controls the disc drive modules so that the divided data are simultaneously read into the disc drive modules in parallel. When the array disc equipment is commanded by the channel to read a datum therefrom, the control unit controls the disc drive modules so that the divided data stored in the disc drive modules are simultaneously read out therefrom in parallel and combines the divided data into the datum to be sent to the channel.

As seen from the above, dividing a datum into the divided data and writing the divided data into the disc drive modules in parallel, and reading the divided data from the disc drive modules in parallel and combining them into the datum, are important features of the array disc equipment. By virtue of developing the auxiliary memory equipment into the array disc equipment having this feature, the speed of data writing and reading has become very high.

Figure 1:
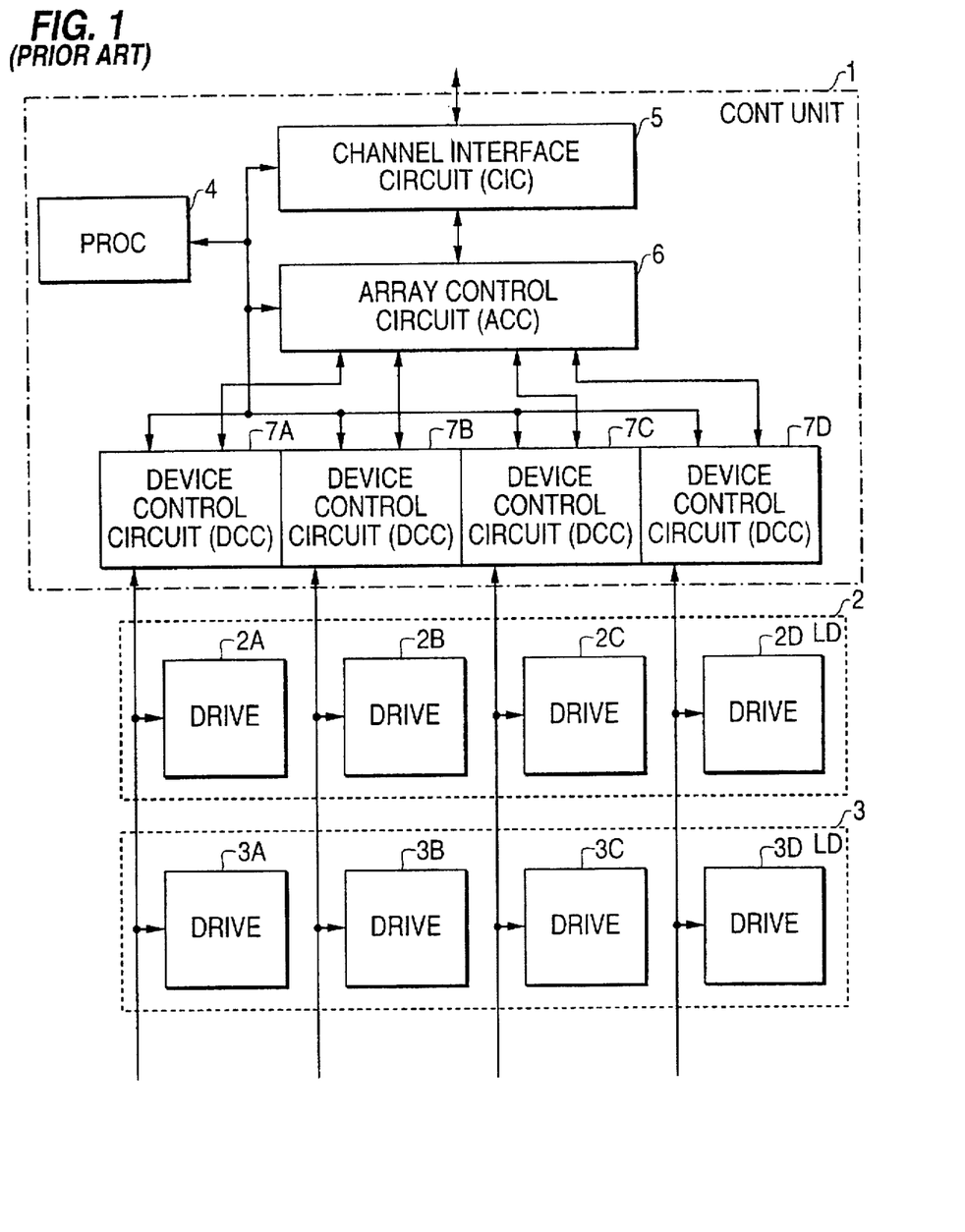
FIG. 1 is a schematic block diagram of the array disc equipment of the related art.

FIG. 1 is a schematic block diagram of an array disc equipment of the related art. In FIG. 1, a box having reference numeral 1 indicates a control unit (CONT UNIT), and boxes having reference numerals 2A to 2D and 3A to 3D indicate disc drive modules (DRIVEs). In consideration of logical addresses used for dividing the received datum into the divided data, DRIVEs are grouped to a plurality of logical devices (LDs). Actually, there are many DRIVEs in the array disc equipment, however, eight DRIVEs 2A to 2D and 3A to 3D are shown and four DRIVEs 2A to 2D and 3A to 3D are grouped to LDs 2 and 3 representatively in FIG. 1. Not depicted in FIG. 1, each DRIVE includes a memory disc, a drive control circuit for controlling a drive of the memory disc and head, and other accessories such as a head mechanically touching the surface of the memory disc.

As shown in FIG. 1, a control unit (CONT UNIT) 1 consists of a channel interface circuit (CIC) 5 placed at a signal entrance and exit of the array disc equipment, connected to the channel, an array control circuit (ACC) 6 connected to CIC 5, four device control circuits (DCCs) 7A to 7D placed between ACC 6 and LDs 2, 3, . . . , and a processor (PROC) 4 connected to CIC 5, ACC 6 and DCCs 7A to 7D. Wherein, the number of DCCs depends on the number of DRIVEs in each LD.

When the array disc equipment receives a command from the channel to write a datum into the array disc equipment, the command is fed to PROC 4 through CIC 5 and PROC 4 allows the channel to send the datum to ACC 6 through CIC 5 and instructs ACC 6 to write the datum into DRIVEs 2A to 2D and 3A to 3D. When ACC 6 receives such instruction from PROC 4 and the datum through CIC 5 and if the datum consists of 8 bytes, ACC 6 divides the datum into 4 divided data, dividing every 2 bytes from the beginning of the 8 byte datum. If the logical address of the datum is designated to LD 2 in the command from the channel, the command is instructed to ACC 6 from PROC 4, then ACC 6 controls DCCs 7A to 7D so that DCCs 7A to 7D access DRIVEs 2A to 2D in LD 2 for storing the divided data therein in parallel. As a result, DCC 7A controls DRIVE 2A so as to position the head on a designated cylinder on a designated track of the memory disc and write the first 2 byte divided data into a designated sector of the designated cylinder. In the same fashion as DCC 7A, other DCCs 7B, 7C and 7D simultaneously write the second, third and fourth 2 byte divided data into designated sectors of the memory discs of DRIVEs 2B, 2C and 2D, respectively, in parallel.

When the array disc equipment receives a command from the channel to read data stored in LD 2, the command is fed to PROC 4 through CIC 5 and PROC 4 instructs ACC 6 so that ACC 6 controls DCCs 7A to 7D so as to read the divided data from DRIVEs 2A to 2D in LD 2, respectively. That is, DCCs 7A to 7D control DRIVEs 2A to 2D in LD 2 so as to position the heads on designated sectors of designated cylinders on designated tracks of DRIVEs 2A to 2D, respectively, and read the 2 byte divided data from DRIVEs 2A to 2D in parallel. The 2 byte divided data read from DRIVEs 2A to 2D are combined to an 8 byte datum in ACC 6 and the 8 byte datum is sent to the channel through CIC 5. The same writing and reading steps as above are performed with respect to DRIVEs 3A to 3D when the array disc equipment receives the write and read commands of LD 3.

Problems of the Prior Art

In the array disc equipment, generally, DRIVEs are connected to DCCs through corresponding connection cables, and the connection cables must be disconnected and connected when DRIVEs are required to be replaced or expanded. Therefore, when the connection cables are reconnected after some DRIVEs are replaced or reinstalled, it is possible that a mistake may be made in the cable connection. If such a mistake is made, the problem occurs that the set positions of DRIVEs will be confused, so that wrong divided data are written into or read from DRIVEs, resulting in making confused data. Furthermore, if this problem occurs in the computer, a lot of time and labor is spent in determining the misconnection of the DRIVEs.

For instance, if some of DRIVEs 2A to 2D are mistaken in connection with DCCs 7A to 7D due to the replacement of some DRIVEs, a datum stored in the array disc equipment becomes impossible to read out correctly from the equipment, which results in a fatal problem within the computer requiring a great deal of effort to determine the wrong connection.

SUMMARY OF THE INVENTION

An object of the present invention, therefore, is to provide an improved array disc memory apparatus which prevents confusion from resulting in data storing and reading when disc drive modules (DRIVEs) are replaced, increased or decreased.

Another object of the present invention is to decrease the difficulty of finding which DRIVE has a wrong cable connection and to save time in restoring the cable connection when DRIVEs are replaced, increased or decreased.

Yet another object of the present invention is to increase the operation reliability of the array disc equipment and a computer including the array disc equipment.

The above objects are accomplished by providing identification information to each DRIVE, a memory for storing the identification information and means for comparing the identification information every time the power of the DRIVEs is turned on. When DRIVEs having good quality are initially installed correctly in the array disc equipment, the identification information is read and stored in the memory as reference identification information. After that, when, for example, one of the DRIVEs is replaced by another DRIVE, the power of the DRIVE is turned off and the replacement is performed. When the replacement is over, the power is turned on. In this case, there is possibility that wrong cable connection occurs. There is the same possibility when DRIVEs are increased or decreased. When the above replacement is performed, the operator usually sets a replacement message in a logical table of the memory without making any mistake because of a supervisory system provided in the array disc equipment or the computer. Then, the identification information of the newly installed DRIVE is read and stored in the memory as the reference identification information instead of the replacement message. Therefore, the confirmation whether DRIVEs are correctly installed with a correct cable connection is performed by the above comparison. Many possibilities of disconnecting and connecting the cables are taken into account because the power of the DRIVEs is always turned off when the connection cables are disconnected and connected thus, so that the confirmation is performed sufficiently by virtue of performing the comparison every time the power of the DRIVEs is turned on.

When a mismatch result is produced due to the comparison, an alarm signal is produced for stopping the computer from sending a data write or read command to the array disc equipment, so that data confusion can be avoided, as will be explained in the first embodiment. In this case, data confusion can be avoided without stopping the computer sending the data write or read command, by providing data path instructions so that the identification information from the actually installed DRIVEs is stored to the correct logical position of the memory. This results in the equivalent of restoring the cable connection. This will be explained in the second embodiment.

DESCRIPTION OF THE PREFERRED EMBODIMENT

Figure 2:
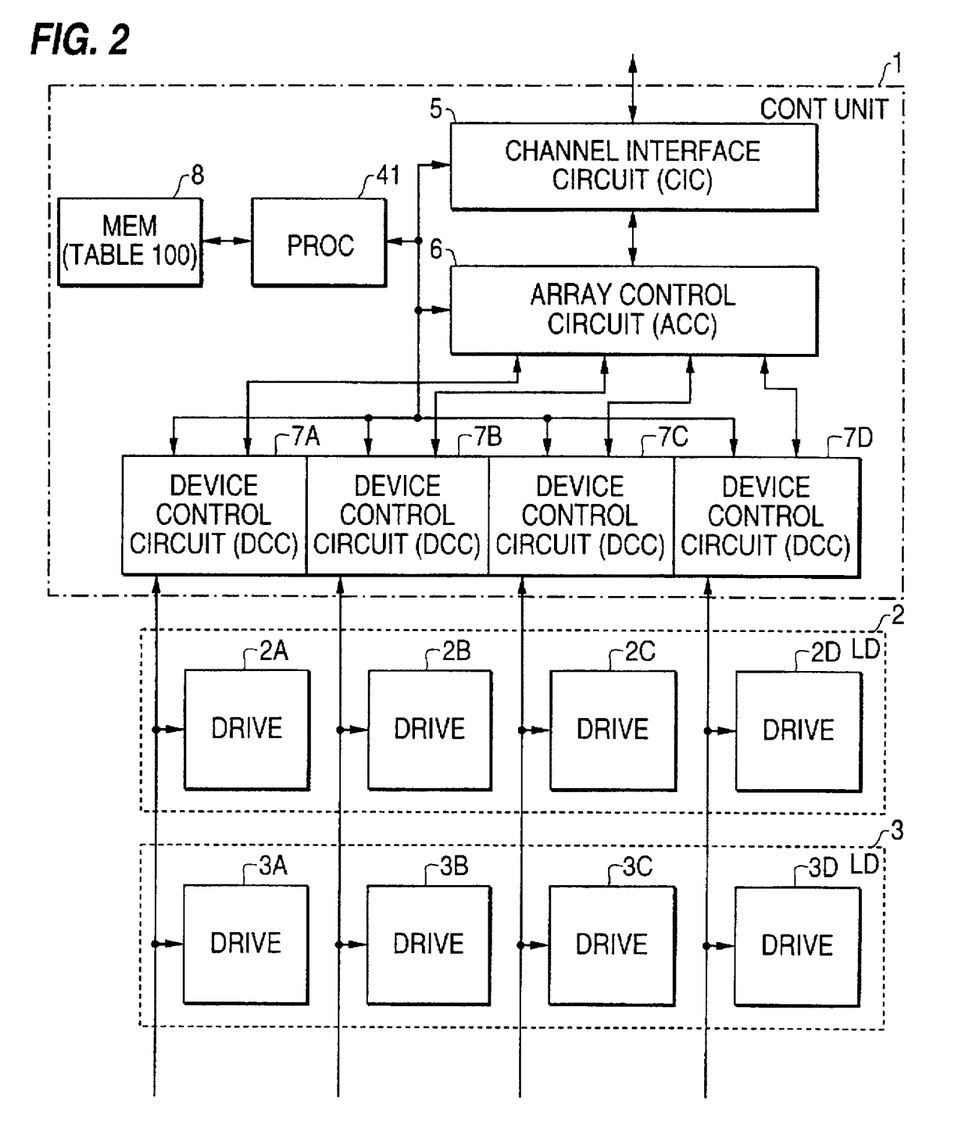
FIG. 2 is a schematic block diagram for a first embodiment of the present invention.

FIG. 2 is a block diagram of a first embodiment of the present invention. In FIG. 2, the same reference numeral or symbol as in FIG. 1 designates the same unit or circuit as in FIG. 1. In FIG. 2, the control unit CONT UNIT 11 is functionally the same as CONT UNIT 1 in FIG. 1 except that CONT UNIT 11 has a non-volatile memory (MEM) 8 which is a random access memory (RAM), for storing identification information on DRIVEs to be correctly installed in the array disc equipment and PROC 41 is provided by modifying PROC 4 in FIG. 1 so as to operate with MEM 8. The identification information can be the actual manufacturing numbers (MF Nos.) of the DRIVEs. The MF Nos. are memorized in a designated area on the memory disc, located, for example, at the last track of the last cylinder of the memory disc and not otherwise usable by users. The MF Nos. will be used as the identification information hereinafter, and MF Nos., stored in MEM 8, of DRIVEs correctly installed and normally operating in the array disc equipment will be called "reference MF Nos." hereinafter. The reference MF Nos. are used by PROC 41 for determining whether DRIVEs installed or reconnected in the array disc equipment due to replacement or expansion are correctly connected by the connection cables in the array disc equipment, by comparing MF Nos. read from the installed DRIVEs with the reference MF Nos. In MEM 8, the state of the installed DRIVEs and the results of the comparison are also stored, forming a kind of a correspondence table. The correspondence table is represented as TABLE 100 in FIG. 2 and an example of TABLE 100 is shown in FIG. 3.

Figure 3:
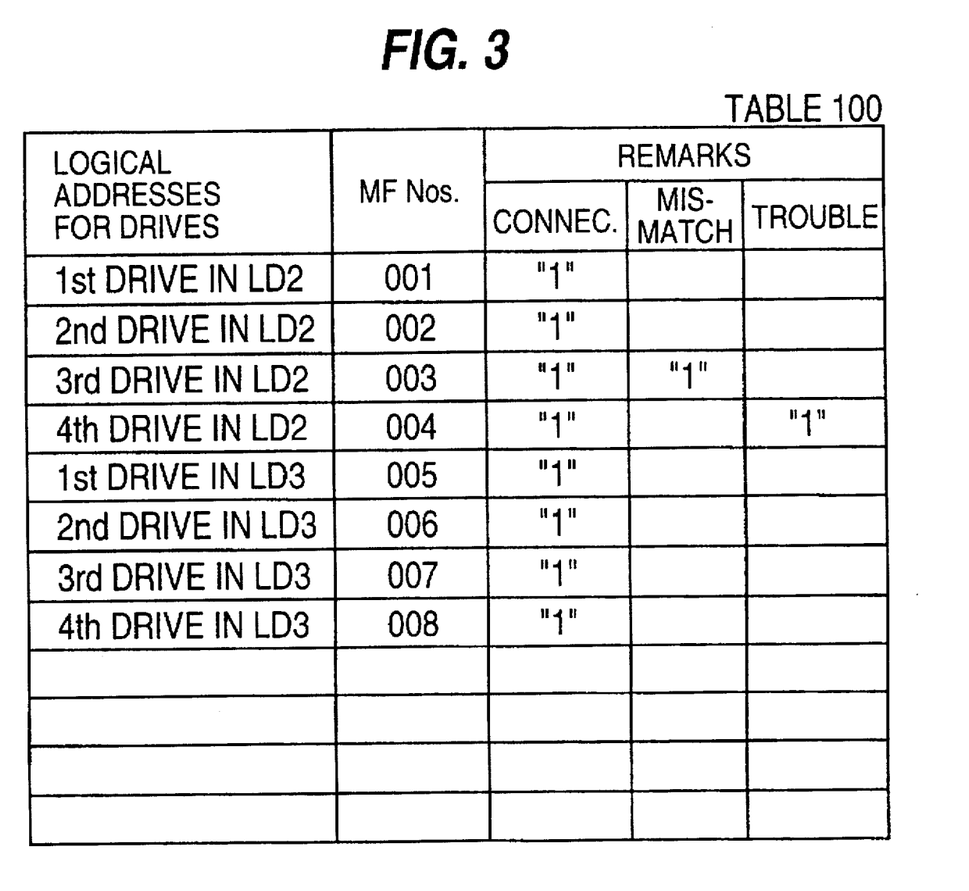
FIG. 3 is a table for explaining a confirming function of the invented array disc equipment.

In TABLE 100 in FIG. 3, the reference MF Nos. and the remarks on the state of the cable connection, the result of comparing between MF Nos. read from the installed DRIVEs and the reference MF Nos. and the trouble of the installed DRIVEs if occur are tabulated in accordance with the logical addresses of DRIVEs to be installed in the array disc equipment. In TABLE 100, 001, 002, --- in the column for "MF Nos." show an example of the reference MF Nos., a flag "1" in the column for CONNEC. represents a good connection, a flag "1" in the column for MISMATCH represents that an MF No. read from an installed DRIVE is not coincided with the reference MF No. of the DRIVE to be installed and a flag "1" in the column for TROUBLE represents that the corresponding DRIVE has trouble. In the column for LOGICAL ADDRESSES in TABLE 100, the blank columns are provided for expanding DRIVEs. The increase or decrease of DRIVEs is usually performed every LD.

Regarding TABLE 100, a rule is implemented that no reference MF No. is ever changed unless an operator of the computer changes the reference MF No. with a message for informing the replacement or the new installation of a DRIVE, by operating a control key-board, not depicted in FIG. 3, equipped to the computer or the array disc equipment. The change of the reference MF Nos. by the operator will be detailed later.

Figure 4:
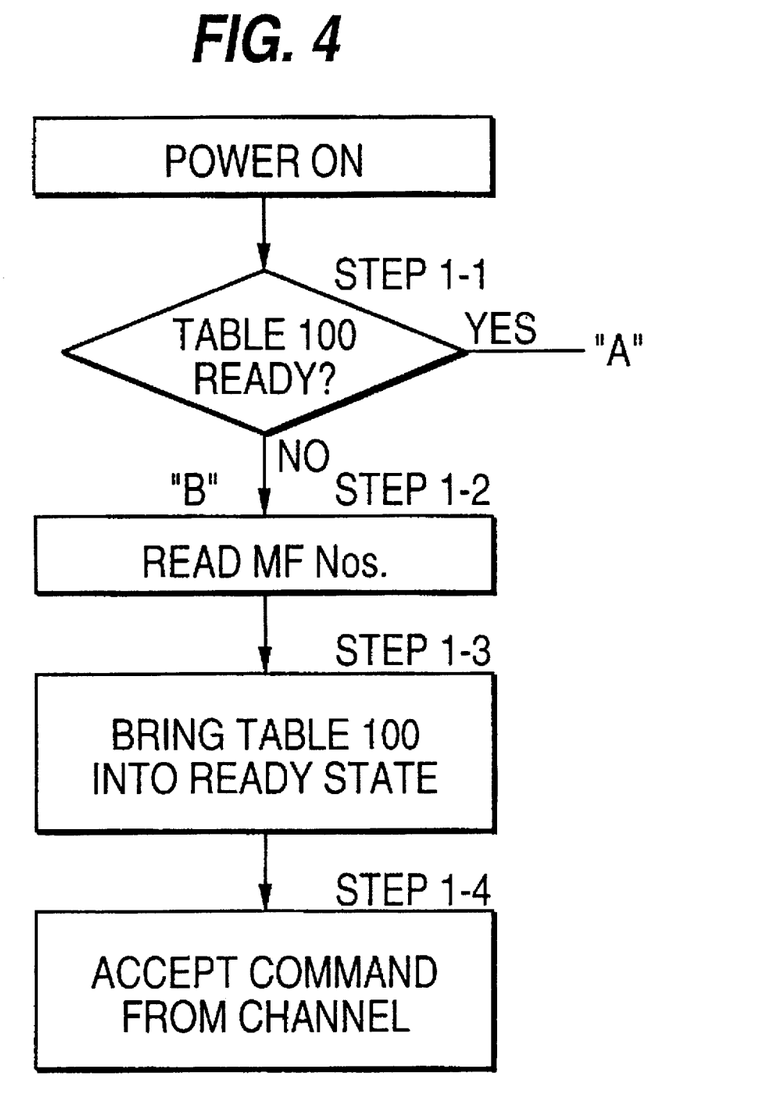
FIG. 4 is a flow chart for explaining a proceeding step for setting MF Nos. of DRIVEs having good quality, initially installed in the array disc equipment of the invention.

When an array disc equipment being an article of good quality is equipped in the computer initially in the factory, the reference MF Nos. must be initially stored in MEM 8. This is performed in accordance with the first flow charts shown in FIG. 4, as follows:

(1) after the array disc equipment is equipped in the computer, the power of the array disc equipment is turned on locally or in accordance with a command from the channel, which is represented as "POWER ON" in FIG. 4;

(2) when the power of the array disc equipment is turned on, the channel asks PROC 41 whether TABLE 100 has a flag representing that the TABLE 100 is ready to be used by filling the TABLE 100 with the reference MF NOs., which is indicated by STEP 1-1, representing "TABLE 100 READY?";

(3) the TABLE 100 has not been accessed yet from the channel because the array disc equipment is firstly equipped, so that PROC 41 will answer back to channel "NO" as shown at STEP 1-1 (the case of "YES" in STEP 1-1 will be explained later by using symbols "A" and "B"), then the channel sends a command to PROC 41 so as to make TABLE 100 in a state ready to be used, therefore, PROC 41 instructs ACC 6 to read the MF Nos. of DRIVEs in the array disc equipment through DCCs 7A to 7D, as indicated by STEP 1-2, representing "READ MF Nos.";

(4) the MF Nos. read from the DRIVEs are sent to PROC 41 so as to be stored in MEM 8 as the reference MF Nos., bringing TABLE 100 in the state ready to be used, which is indicated by STEP 1-3, representing "BRING TABLE 100 INTO READY STATE"; and (5) when TABLE 100 becomes the ready state in STEP 1-3, the channel sends a command to PROC 41 to write or read data into or from the DRIVEs, then the data writing or reading is performed as explained in reference to FIG. 1, which is indicated by STEP 1-4, representing "ACCEPT COMMAND FROM CHANNEL".

Figure 5:
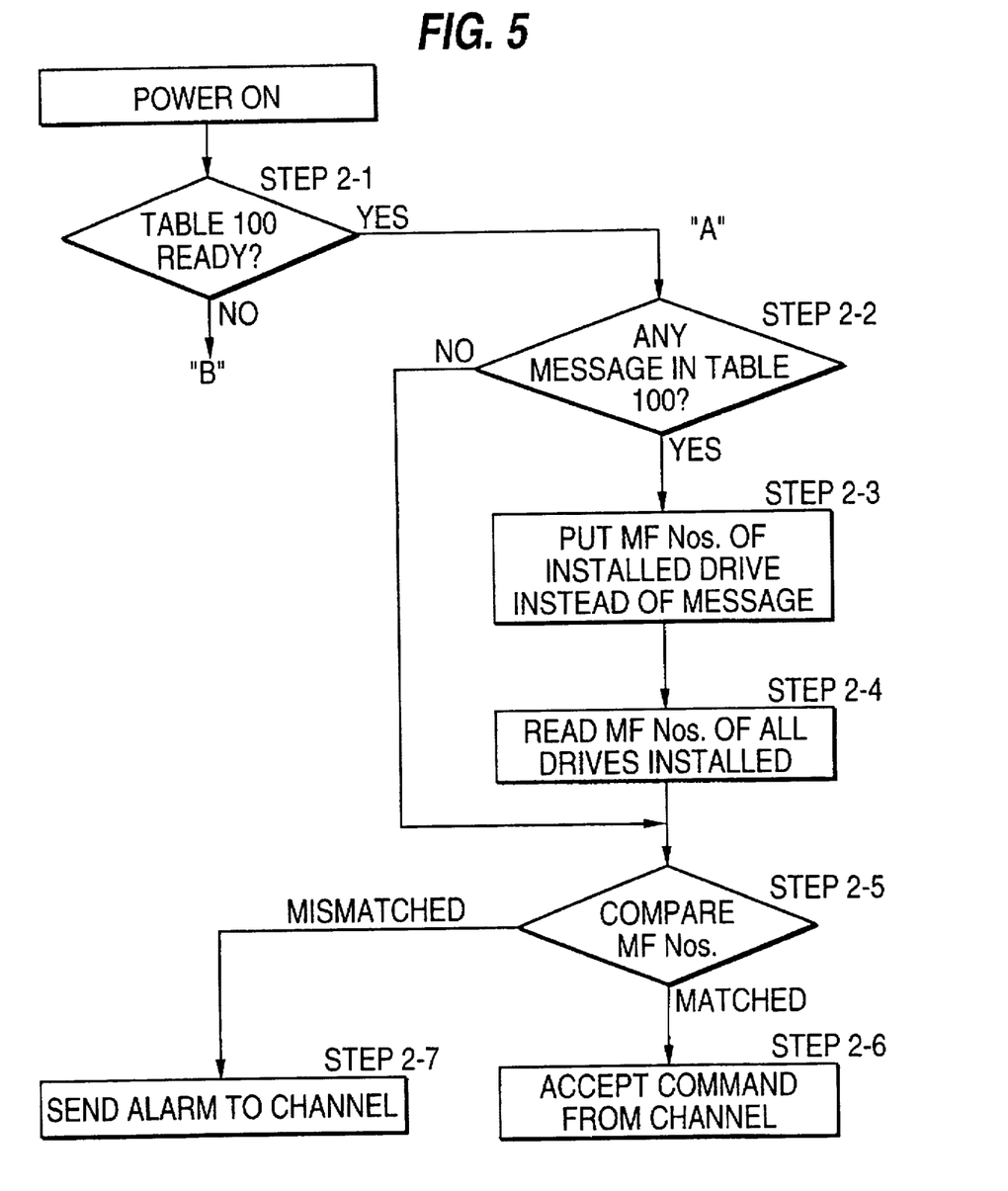
FIG. 5 is a flow chart for explaining a proceeding step for writing MF Nos. of newly replaced DRIVEs in the table and confirming whether cables are correctly connected.

During the time when write or read operation is performed in the array disc equipment, however, the hardware trouble cannot be avoided from occurring in the DRIVEs. When the trouble occurs in the DRIVEs, the trouble is usually backed up by other auxiliary DRIVEs in LD. However, if the trouble increase beyond a predetermined threshold, PROC 41 catches this fact and produces an alarm signal, storing a trouble flag "1" in TABLE 100 as shown in FIG. 3. The alarm signal is also sent to inform the operator which is the faulty DRIVE. When the operator finds the faulty DRIVE, he turns the local power of the faulty DRIVE or the power of the array disc equipment off and replaces the faulty DRIVE with a new good DRIVE. Then, the operator edits TABLE 100, by operating the control key-board, so as to put a replacement message in TABLE 100, instead of the reference MF Nos. of the faulty DRIVE. As a result of the change made to TABLE 100, the trouble flag in TABLE 100 disappears due to the work of PROC 41. When a DRIVE is replaced thus, TABLE 100 is renewed by putting a new MF No. of the replaced DRIVE in the column having the replacement message and confirms whether the replaced DRIVE is correctly installed. The steps of putting the new MF No. of the replaced DRIVE in TABLE 100 and confirming whether the replaced DRIVE is installed proceed in accordance with the second flow chart shown in FIG. 5, as follows:

(1) the local power of the replaced DRIVE or the power of the array disc equipment is turned on after replacing the DRIVE and editing TABLE 100 so as to put the replacement message on the column instead of the reference MF No. of the faulty DRIVE, which is represented as "POWER ON" in FIG. 5;

(2) then the channel commands PROC 41 to ask whether TABLE 100 is ready, as indicated by STEP 2-1, representing "TABLE 100 READY?";

(3) the TABLE 100 has been in the ready state in this case, so that PROC 41 answers back to the channel "YES" as shown in STEP 2-1 (symbol "A" indicates this case, and "NO" in STEP 2-1 has been explained in reference to FIG. 4 as indicated by symbol "B"), then the channel asks PROC 41 whether TABLE 100 has any message on the column for the reference MF Nos., as indicated by STEP 2-2, representing "ANY MESSAGE IN TABLE 100?";

(4) since there is the replacement message in MEM 100, PROC 41 answers back to the channel "YES" as shown in STEP 2-2, then the channel commands PROC 41 so as to put the MF No. of the replaced DRIVE in the column having the replacement message, then PROC 41 reads the MF No. of the replaced DRIVE and stores it in the column, as indicated by STEP 2-3, representing "PUT MF No. OF INSTALLED DRIVE INSTEAD OF MESSAGE";

(5) after putting the MF No. of the replaced DRIVE, PROC 41 instructs DCCs to read MF Nos. of all DRIVEs installed in the array disc equipment, as indicated by STEP 2-4, representing "READ MF Nos. OF ALL DRIVES";

(6) then PROC 41 compares the read MF Nos. with MF Nos., which are now the reference MF Nos., stored in MEM 8 (TABLE 100), as indicated by STEP 2-5, representing "COMPARE MF Nos.";

(7) after performing the comparison in STEP 2-4, if the MF Nos. read from the installed DRIVEs coincide with those stored in MEM 8 as shown by "YES" in STEP 2-5, PROC 41 accepts the command from the channel so as to perform the data write or read, as indicated by STEP 2-6, representing "ACCEPT COMMAND FROM CHANNEL"; and (8) if the MF Nos. read from the installed DRIVEs do not coincide with those stored in MEM 8, PROC 41 sends an alarm signal to the channel so as not to send the command for performing the data writing or reading to the array disc equipment any more, as indicated by STEP 2-7, representing "SEND ALARM TO CHANNEL".

As seen in the second flow chart, the operator performs two operations which are prone to mistake, one is replacing DRIVEs by disconnecting and connecting the cables and the other is operating the control key-board. However, no mistake can be made during the latter, because the array disc equipment or the computer provides a supervisory system by which a wrong operation of the control key-board can never occur. The former operation, however, has the possibility of a mistake. In particular, the wrong cable connection may be made during the replacement of the DRIVEs. However, this mistake can be found out in STEP 2-5. Because, if a mistake about the cable connection is made, MF Nos. read from the replaced DRIVEs never coincide with the reference MF Nos. stored in MEM 8.

In the case of increasing or decreasing DRIVEs, the mistake of the cable connection cannot be made because the increase or decrease of the DRIVEs is performed for every LD and not every DRIVE. However, since LDs are usually moved here and there in the setting field of the computer for increasing or decreasing DRIVEs, it is possible to make a mistake in the cable connection. Therefore, whether the DRIVEs are all correctly installed must be confirmed after the DRIVE increase or decrease is complete.

When DRIVEs are increased, the operator edits TABLE 100 by operating the control key-board so as to put increase messages in blank columns in MF Nos. columns, for informing where the DRIVEs are to be installed for increasing, after the increase of DRIVEs is complete. When the DRIVEs are decreased, the operator edits TABLE 100 by operating the control key-board so as to put decrease messages in the columns for the MF Nos. of the removed DRIVEs instead thereof, after the DRIVEs to be decreased are removed from the array disc equipment.

After amending TABLE 100, the step of confirming whether the increase or decrease of DRIVEs is correctly performed (in other words, whether the cable connection for the increase or decrease of DRIVEs is correctly performed) is performed in accordance with the same flow chart as in FIG. 5.

In the above case of replacing, increasing or decreasing DRIVEs, it is possible that an answer of "NO" is output from, for example, STEP 2-2 when the operator forgets to edit TABLE 100. However, though the operator makes this mistake in operating the control key-board, in other words, though "NO" is output from STEP 2-2, this mistake can be detected in STEP 2-5 by outputting the alarm signal through STEP 2-7, producing no problem.

According to the first embodiment, if the mistake is made in the cable connection when the DRIVEs are replaced, increased or decreased, PROC 41 only sends the alarm signal to the channel so as to stop the channel sending further commands for the data writing or reading to PROC 41. Therefore, when the wrong cable connection occurs, the operator must check where the wrong cable connection exists and correct the cable connection. If the wrong cable connection can be changed by the array disc equipment itself instead of the operator, the operator becomes free from the trouble of changing the cable connection and the time spent for making that change can be saved. This improvement is realized in the second embodiment of the present invention.

Figure 6:
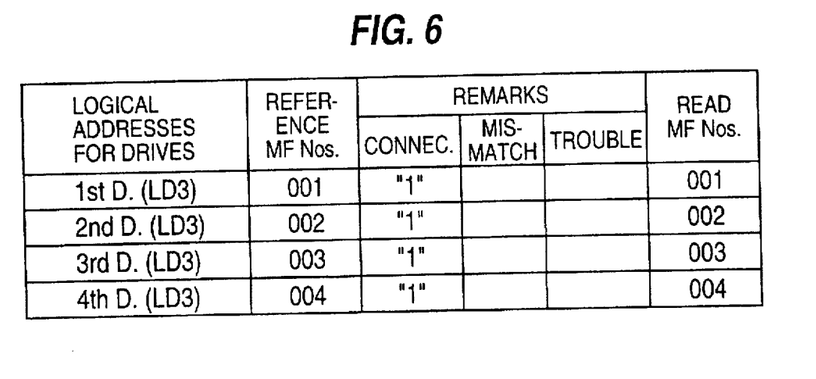
FIG. 6 is an example of the table when DRIVEs are correctly installed in the logical positions respectively with correct cable connection in case of initial installation.
Figure 7:
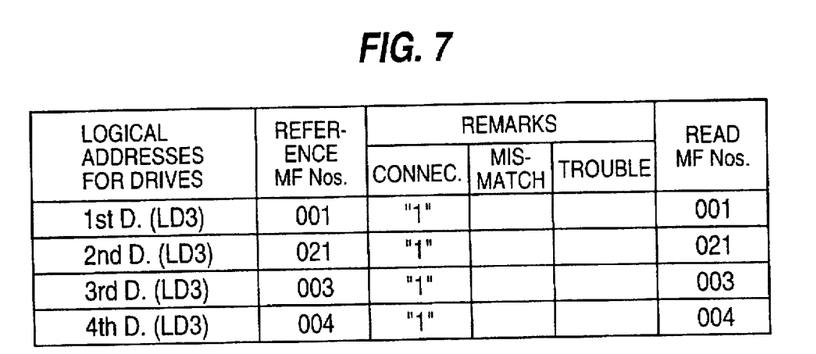
FIG. 7 is another example of the table when a DRIVE is replaced to another but installed correctly with correct cable connection.
Figure 8:
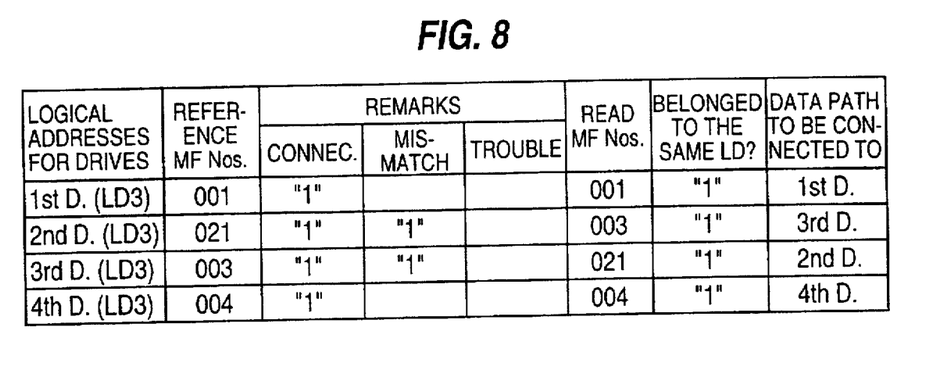
FIG. 8 is still another example of the table when DRIVEs are installed incorrectly with wrong cable connection.
Figure 9:
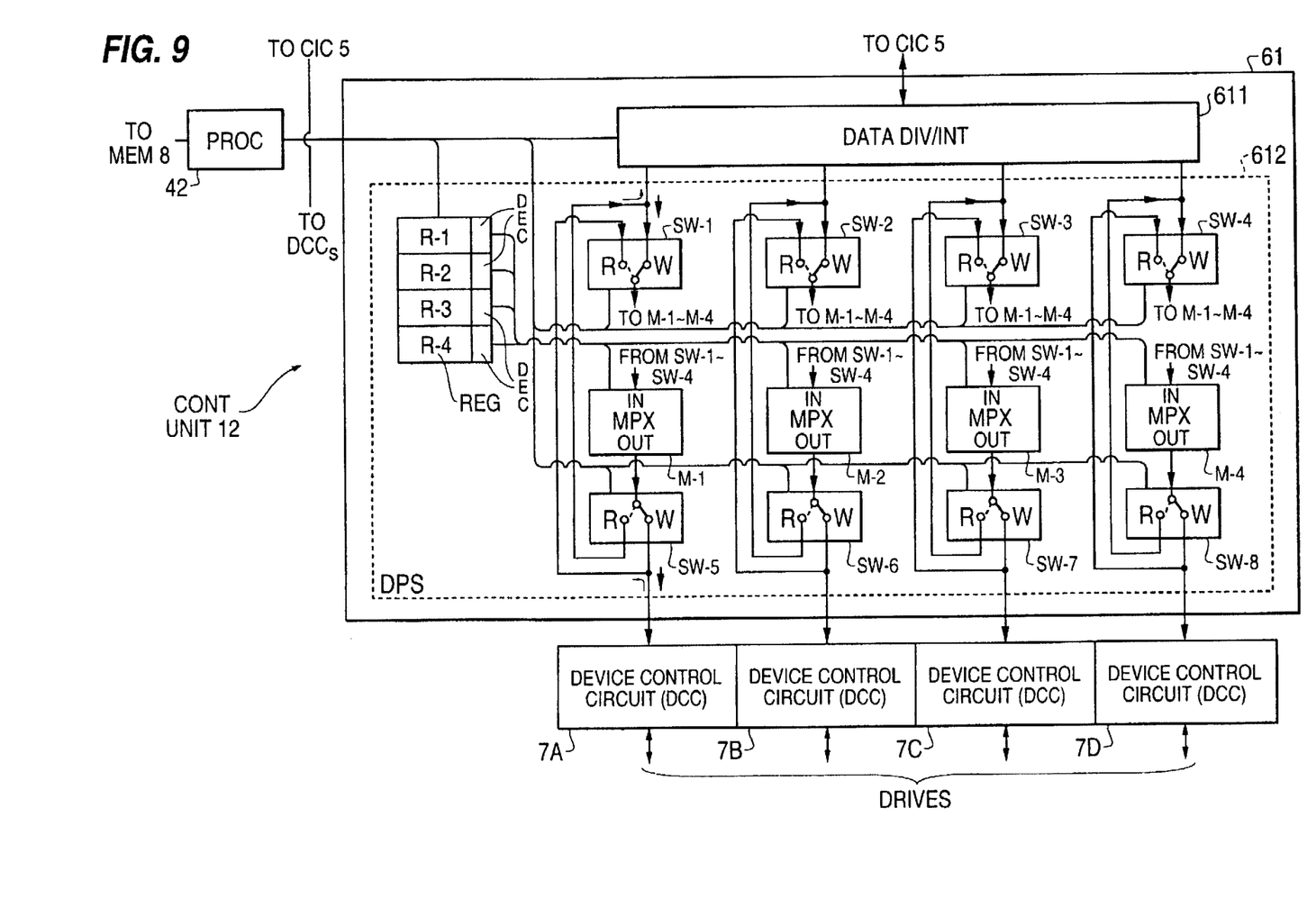
FIG. 9 is a schematic block diagram of a data path setting circuit in the array disc equipment secondly embodying the present invention.

Before explaining the second embodiment the TABLE 100 will be discussed more in reference to FIGS. 6 to 8 and, in particular, the case of the wrong cable connection will be explained in reference to FIG. 8. A concrete explanation of the second embodiment will be made by using a schematic block diagram shown in FIG. 9. In FIGS. 6 to 8, the same reference symbol as in FIG. 3 designates the same logical address, MF Nos. or flag "1" as in FIG. 3 except that DRIVE is partially abbreviated as D. In FIG. 9, the same numeral or symbol as in FIG. 2 designates the same unit or circuit as in FIG. 2 except that CONT UNIT 12, PROC 42 and ACC 61 are functionally same as CONT UNIT 11, PROC 41 and ACC 6 respectively but modified in accordance with the second embodiment. Furthermore in FIG. 9, a data dividing and integrating circuit (DATA DIV/INT) 611 is the prior art circuit having been in ACC 6 in FIG. 1 or 2, except that a data path setting circuit (DPS) 612 is a new circuit provided for the second embodiment.

FIG. 6 shows an example of TABLE 100 having no wrong cable connection and no trouble. However, another column "READ MF Nos." is attached to TABLE 100 for the sake of explanation. The column "READ MF Nos." is for the read MF Nos. for DRIVEs installed the array disc equipment.

FIG. 7 shows an example of a case when a DRIVE at the logical address of second drive in LD 3 (2nd D.(LD3)) is replaced by performing the correct cable connection.

When the cables for the DRIVEs in 2nd D.(LD3) and 3rd D.(LD3) are mistakeably connected so as to be connected in opposite to each other, two MISMATCH flags "1"s appear in respective columns as shown in FIG. 8. The mismatch will be clear by comparing columns for REFERENCE MF Nos. and READ MF Nos. in FIG. 8. When this wrong cable connection occurs, the alarm signal is output to the channel from PROC 41 in the first embodiment. However in the second embodiment, PROC 42 confirms that the installed DRIVEs are all belonged to the same LD 3 after the replacement is over, as shown by flags "1"s in the columns BELONGED TO THE SAME LD in FIG. 8 and determines how the data paths should be changed for connecting the installed DRIVEs correctly, by comparing MF Nos. in columns REFERENCE MF NOs. and READ MF Nos. Then, PROC 42 instructs ACC 61 so as to set the connection right by switching the route between ACCs 7A to 7D and DATA DIV/INT 611 in DPS 612 in accordance with the determination of the data path.

In FIG. 8, additional columns like READ MF Nos., BELONGED TO THE SAME LD? and DATA PATH TO BE CONNECTED TO are provided in TABLE 100, however, they can be stored in PROC 42.

FIG. 9 is a schematic block diagram focused on ACC 61 for explaining the second embodiment. In FIG. 9, the same reference numeral as in FIG. 2 designates the same unit or circuit as in FIG. 2. Comparing with ACC 6 used in the prior art or the first embodiment, in ACC 61, a data path setting circuit (DPS) 612 is added to the data dividing and integrating circuit (DATA DIV/INT) 611 of the prior-art. The DPS 612 includes the same number of multiplexers (four) as the number of multiplexers (MPXs) M-1, M-2, M-3 and M-4, DRIVEs in each LD, input switching circuits (input SWs) S-1, S-2, S-3 and S-4 placed at the inputs of MPXs and output switching circuits (output SWs) S-5, S-6, S-7 and S-8 placed at the outputs of MPXs, respectively.

The MPXs M-1 to M-4 are for setting the paths of the divided data produced from DATA DIV/INT 611 to DCCs respectively when the divided data are written into the DRIVEs and for setting the paths of the divided data produced from the DCCs 7A to 7D to DATA DIV/INT 611 respectively when the divided data stored in DRIVEs are integrated at DATA DIV/INT 611. The paths are set in MPXs M-1 to M-4 by the instruction given from PROC 42. The instruction is produced in accordance with DATA PATH TO BE CONNECTED TO explained in reference to FIG. 8 and once stored in a register (REG). The REG consists of divided registers R-1, R-2, R-3 and R-4 for storing the instruction to M-1, M-2, M-3 and M-4 respectively and coders (COD) attached to the divided registers respectively. When the MISMATCHED flags appear in TABLE 100 as shown in FIG. 8, PROC 42 sends the instructions to R-2 and R-3 corresponding to the DRIVEs having the wrong cable connection. The instructions sent to R-2 and R-3 are coded by COD attached to R-2 and R-3 and sent to MPXs M-2 and M-3, for changing the data paths between DCC 7B and DATA DIV/INT 611 and between DCC 7C and DATA DIV/INT 611.

In FIG. 9, the data routes are set as follows: the input routes (INs) to MPXs M-1 to M-4 are switched by input SWs S-1 to S-4 so that the outputs from DATA DIV/INT 611 are fed to MPXs M-1 to M-4 and the output routes (OUTs) from MPXs M-1 to M-4 are switched by output SWs S-5 to S-8 so that inputs to DCCs 7A to 7D are output from the MPXs M-1 to M-4 respectively, by a write instruction (W)

from PROC 42; and the input routes (INs) to MPXs M-1 to M-4 are switched by input SWs S-1 to S-4 so that the outputs from DCCs 7A to 7D are fed to MPXs M-1 to M-4 and the output routes (OUTs) from MPXs M-1 to M-4 are switched by output SWs S-5 to S-8 so that inputs to DATA DIV/INT 611 are output from the MPXs M-1 to M-4 respectively, by a read instruction (R) from PROC 42.

What is claimed is:

1. An array disc memory apparatus coupled to a computer, for storing a datum sent from the computer by dividing the datum into a plurality of divided data and storing the divided data, and for reading the datum and sending the datum to the computer by reading the divided data and combining the divided data into a read datum, said array disc memory apparatus comprising:

a plurality of disc drive modules for storing the divided data, each including a memory disc on which is memorized respective identification information identifying the disc drive module prior to coupling to the computer;

memory means for storing a correspondence table identifying a correspondence between previous identification information on said disc drive modules and designated logical addresses indicating locations where said disc drive modules are previously installed in designated positions of said array disc memory apparatus, the correspondence table having records for said disc drive modules including the designated logical addresses, the previous identification information, connection flags for indicating when connections are made to said disc drive modules and mismatch flags for indicating a mismatch between present identification information and the previous identification information for the designated logical addresses;

read means for reading, based on the designated logical addresses, the present identification information on said disc drive modules presently installed in the designated positions; and comparison means for comparing the present identification information with the previous identification information indicated by the designated logical addresses every time said disc drive modules change from an unpowered state to a powered state.

2. An array disc memory apparatus according to claim 1, wherein the previous identification information is identification information on said disc drive modules initially installed in the designated positions when the disc drive modules are initialized.

3. An array disc memory apparatus according to claim 1, wherein the present identification information read by said read means is obtained when power of the disc drive modules installed in the designated positions, is turned on.

4. An array disc memory apparatus according to claim 1, further comprising:

means for outputting alarm information to the computer for stopping the computer from sending a data write command to the array disc memory apparatus when the array disc memory apparatus operates under the data write command sent from the computer, and from sending a data read command to the array disc memory apparatus when the array disc memory apparatus operates under the data read command sent from the computer, when said comparison means outputs a comparison result that the present identification information does not coincide with the previous identification information; and means for allowing the computer to send a data write command to the array disc memory apparatus when the array disc memory apparatus operates under the data write command sent from the computer, and to send a data read command to the array disc memory apparatus when the array disc memory apparatus operates under the data read command sent from the computer, when said comparison means outputs a comparison result that the present identification information coincides with the previous identification information.

5. An array disc memory apparatus according to claim 1, further comprising:

confirmation means for confirming, after performing the comparison by said comparison means, whether the disc drive modules installed in the designated positions and producing the present identification information, belong to group have the present identification information which is identical to the previous identification information;

data division and integration means for dividing the datum sent from the computer to the array disc memory apparatus into the divided data to be stored in the disc drive modules, when the array disc memory apparatus operates under a data write command sent from the computer, and for integrating the divided data read from the disc drive modules into the datum to be sent to the computer, when the array disc memory apparatus operates under a data read command sent from the computer; and data path setting means coupled between the data division and integration means and the disc drive modules, for setting a data path between said data division and integration means and the disc drive modules in accordance with data path instructions sent from the computer, so that the divided data expected to be input to disc drive modules having previous identification information are input to installed disc drive modules having the same present identification information as the previous identification information, when the array disc memory apparatus operates under the write command, and the divided data expected to be output from disc drive modules having previous identification information are output from installed disc drive modules having the same present identification information as the previous identification information, respectively, when the array disc memory apparatus operates under the read command.

6. An array disc memory apparatus according to claim 1, wherein the present identification information uniquely identifies a respective disc drive module relative to any other disc drive module.

7. An array disc memory apparatus according to claim 6, wherein the present identification information includes a manufacturing number.

8. A memory as claimed in claim 7, wherein the previous identification information includes a manufacturing number.

9. An array disc memory apparatus coupled to a computer, for storing a datum sent from the computer by dividing the datum into a plurality of divided data and storing the divided data, and for reading the divided data and combining the divided data into a read datum and sending the read datum to the computer, said array disc memory apparatus comprising:

a plurality of disc drive modules for storing the divided data, each including a memory disc on which is memorized respective identification information identifying the disc drive module prior to coupling to the computer;

memory means for storing a correspondence table identifying a correspondence between previous identification information on said disc drive modules and designated logical addresses indicating locations where said disc drive modules are previously installed in designated positions of said array disc memory apparatus;

read means for reading, based on the designated logical addresses, present identification information on said disc drive modules presently installed in the designated positions;

comparison means for comparing the present identification information with the previous identification information indicated by the designated logical addresses every time said disc drive modules change from an unpowered state to a powered state;

confirmation means for confirming, after performing the comparison by said comparison means, whether the disc drive modules installed in the designated positions and producing the present identification information, belong to a single group have the present identification information which is identical to the previous identification information;

data division and integration means for dividing the datum sent from the computer to the array disc memory apparatus into the divided data to be stored in the disc drive modules, when the array disc memory apparatus operates under a data write command sent from the computer, and for integrating the divided data read from the disc drive modules into the datum to be sent to the computer, when the array disc memory apparatus operates under a data read command sent from the computer; and data path setting means coupled between the data division and integration means and the disc drive modules, for setting a data path between said data division and integration means and the disc drive modules in accordance with data path instructions sent from the computer, so that the divided data expected to be input to disc drive modules having previous identification information are input to installed disc drive modules having the same present identification information as the previous identification information, when the array disc memory apparatus operates under the write command, and the divided data expected to be output from disc drive modules having previous identification information are output from installed disc drive modules having the same present identification information as the previous identification information, respectively, when the array disc memory apparatus operates under the read command, said data path setting means including multiplexers of the same number as the disc drive modules, for forming the data path in accordance with the data path instructions, and switching means for performing switching so that the divided data output from said data division and integration means are sent to said multiplexers and the divided data output from said multiplexers are sent to the disc drive modules, respectively, when the array disc memory apparatus operates under the data write command, and divided data stored in the disc drive modules are sent to said multiplexers and the divided data output from said multiplexers are sent to said data division and integration means, when the array disc memory apparatus operates under the data read command.

10. An array disc storage apparatus for storing and controlling storage of data used by a computer, comprising:

an array disc memory device having n disc drives, each disc drive having a disc storing the data used by the computer and identification information identifying the disc; and a control unit having a memory storing a correspondence table identifying a correspondence between the identification information and logical addresses of the n disc drives indicating locations where the n disc drives are installed in designated positions of said array disc memory device, the correspondence table having records for the n disc drives including the logical addresses, previous identification information, connection flags for indicating when connections are made to the n disc drives and mismatch flags for indicating a mismatch between present identification information and the previous identification information for the logical addresses, said control unit having n device control circuits coupled to a corresponding one of the n disc drives and passing the data thereto and therefrom, in accordance with at least a part of the identification information and at least one logical address stored in the memory.

11. A memory for use with an array of disc drive modules having respective logical addresses in the array, comprising:

a memory storing a correspondence table identifying a correspondence between previous identification information identifying at least one of the disc drive modules previously installed in the array, the previous identification information for the at least one of the disc drive modules being obtained initially from the at least one of the disc drive modules, and a corresponding one of the respective logical addresses at which the at least one of the disc drive modules is located in the array, the correspondence table having records for the disc drive modules including the respective logical addresses, the previous identification information, connection flags for indicating when connections are made to the disc drive modules and mismatch flags for indicating a mismatch between present identification information and the previous identification information for the respective logical addresses.

12. An apparatus as claimed in claim 11, further comprising:

a processor coupled to the memory and the array of disc drive modules, for reading present identification information from one of the disc drive modules using a respective logical address indicating the one of the disc drive modules, for reading the previous identification information for the one of the disc drive modules from the memory using the respective logical address, and for comparing the present and previous identification information for the one of the disc drive modules to generate a result.

13. An apparatus as claimed in claim 12, further comprising:

an alarm coupled to the processor, for generating an alarm indication based on the result.

14. An apparatus as claimed in claim 12, wherein the memory stores mismatch information in association with the logical addresses, the mismatch information for the one of the disc drive modules being generated based on the result and stored by the processor at the respective logical address.

15. An apparatus as claimed in claim 14, wherein the memory stores trouble information indicating a malfunction of the one of the disc drive modules, the trouble information being stored in association with the respective logical address for the one of the disc drive modules.

16. A memory as claimed in claim 12, wherein the previous identification information uniquely identifies the at least one disc drive module relative to any other disc drive module.

17. A system comprising:

an array of disk drive modules each storing drive identification information prior to installation in said system and having a logical address in said array;

a memory to store a correspondence table identifying a correspondence between reference identification information based upon previously obtained drive identification information of each of the disk drive modules and the logical address of each of the disk drive modules, the correspondence table having records for the disk drive modules, each record including the logical address, the reference identification information, a connection flag for indicating when connections are made to a corresponding disk drive module and mismatch flags for indicating a mismatch between the drive identification information and the reference identification information for the logical address; and a processor coupled to the disk drive modules and said memory, to read the drive identification information from the disk drive modules using the logical address of each of the disk drive modules, and to compare the reference identification information stored in said memory, with the drive identification information stored in each of the disk drive modules, to generate a result indicative of whether the disk drive modules are properly coupled in said array.

18. A system as claimed in claim 17, wherein said processor refrains from accessing data in the disk drive modules, based on the result indicating improper coupling of the disk drive modules, until the disk drive modules are coupled in a predetermined arrangement in said array.

19. A system as claimed in claim 17, wherein said processor modifies data paths in said array of the disk drive modules, based on the result.

20. A system as claimed in claim 17, wherein the drive identification information of each of the disk drive modules, is a manufacturer serial number of each of the disk drive modules.

21. A system as recited in claim 17, wherein said memory is a non-volatile memory.

* * * * *

UNITED STATES PATENT AND TRADEMARK OFFICE
CERTIFICATE OF CORRECTION

PATENT NO. : 5,721,861
DATED : February 24, 1998
INVENTOR(S) : Yumiko CHIZUMI

It is certified that error appears in the above-indentified patent and that said Letters Patent is hereby corrected as shown below:

```
Column 5, line 47, change "increase to --increases--

Column 7, line 67, insert --in-- after "installed"

Column 8, line 20, change "ACCs" to --DCCs--

Column 10, line 15, insert --a single-- after "to".
```

Signed and Sealed this

Fifteenth Day of September, 1998

Attest:

BRUCE LEHMAN

Attesting Officer

Commissioner of Patents and Trademarks